(12) United States Patent
Meisner

(10) Patent No.: US 8,554,407 B2
(45) Date of Patent: Oct. 8, 2013

(54) BYPASS VALVE AND COOLANT FLOW CONTROLS FOR OPTIMUM TEMPERATURES IN WASTE HEAT RECOVERY SYSTEMS

(75) Inventor: Gregory P. Meisner, Ann Arbor, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 79 days.

(21) Appl. No.: 13/247,502

(22) Filed: Sep. 28, 2011

(65) Prior Publication Data

US 2013/0079981 A1  Mar. 28, 2013

(51) Int. Cl.
*G01C 21/00* (2006.01)
(52) U.S. Cl.
USPC .......................................................... 701/36
(58) Field of Classification Search
CPC ..................................................... F01N 5/025
USPC .......................................................... 701/36
See application file for complete search history.

(56) References Cited

U.S. PATENT DOCUMENTS

| | | | |
|---|---|---|---|
| 2004/0221577 A1* | 11/2004 | Yamaguchi et al. | 60/520 |
| 2010/0024859 A1* | 2/2010 | Bell et al. | 136/201 |
| 2011/0099989 A1* | 5/2011 | Prior et al. | 60/320 |
| 2011/0240080 A1* | 10/2011 | Prior et al. | 136/201 |
| 2011/0308560 A1* | 12/2011 | Arbuckle et al. | 136/205 |

* cited by examiner

*Primary Examiner* — James Trammell
*Assistant Examiner* — Michael D Lang
(74) *Attorney, Agent, or Firm* — Cantor Colburn LLP

(57) ABSTRACT

Implementing an optimized waste heat recovery system includes calculating a temperature and a rate of change in temperature of a heat exchanger of a waste heat recovery system, and predicting a temperature and a rate of change in temperature of a material flowing through a channel of the waste heat recovery system. Upon determining the rate of change in the temperature of the material is predicted to be higher than the rate of change in the temperature of the heat exchanger, the optimized waste heat recovery system calculates a valve position and timing for the channel that is configurable for achieving a rate of material flow that is determined to produce and maintain a defined threshold temperature of the heat exchanger, and actuates the valve according to the calculated valve position and calculated timing.

15 Claims, 4 Drawing Sheets

BYPASS VALVE AND COOLANT FLOW CONTROLS FOR OPTIMUM TEMPERATURES IN WASTE HEAT RECOVERY SYSTEMS

FEDERAL RESEARCH STATEMENT

This invention was made with Government support under DE-FC26-04NT42278, awarded by the Department of Energy. The U.S. Government has certain rights in the invention.

FIELD OF THE INVENTION

The subject invention relates to waste heat recovery systems and, more particularly, to bypass valve and coolant flow controls for optimum temperatures in a waste heat recovery system.

BACKGROUND

Waste heat recovery systems seek to recover and repurpose heat that is produced as a result of various processes, such as internal combustion engine-generated heat in an automobile. In the automotive industry, thermoelectric generators (TEGs) are employed in vehicles to harvest this waste heat and convert the waste heat to electricity for use by other components of the vehicles.

In a typical thermoelectric generator for waste heat recovery from exhaust gas, heat exchangers are passive metal chambers with baffles and/or fins through which the exhaust gas or coolant flow. The temperature of the hot and cold side heat exchangers is determined by the heat load of the exhaust gas and the efficiency of the cooling circuit, the heat capacity of the system components, and the efficiency of the heat recovery process. If there are high levels of excess heat, such as when the engine is under heavy load, the heat recovered could cause the temperature of the waste heat recovery system to exceed its operating limits. Typically, a bypass valve is incorporated into the system so that the exhaust gas can be shunted around the thermoelectric generator to prevent overheating; however, this can lead to a lower overall efficiency of the waste heat recovery when the operating temperatures of the hot and cold side heat exchangers in the system are not optimized.

Accordingly, it is desirable to provide temperature stability of the hot and cold side heat exchangers of the thermoelectric generators at optimum operating temperatures in order to maximize electrical power generation efficiency, as well as lengthen the useful life of the thermoelectric modules.

SUMMARY OF THE INVENTION

In one exemplary embodiment of the invention, a method for implementing an optimized waste heat recovery system is provided. The method includes calculating a temperature and a rate of change in temperature of a heat exchanger of the waste heat recovery system, and predicting a temperature and a rate of change in temperature of a material flowing through a channel of the waste heat recovery system. Upon determining that the rate of change in the temperature of the material is predicted to be higher than the rate of change in the temperature of the heat exchanger, the optimized waste heat recovery system calculates a valve position and valve timing for the channel that is configurable for achieving a rate of material flow that is determined to produce and maintain a defined threshold temperature of the heat exchanger, and actuates the valve according to the calculated valve position and time.

In another exemplary embodiment of the invention, a system for optimized waste heat recovery system is provided. The system includes a control system in communication with a waste heat recovery system. The control system includes a computer processor configured to execute logic. The logic implements a method. The method includes calculating a temperature and a rate of change in temperature of a heat exchanger of the waste heat recovery system, and predicting a temperature and a rate of change in temperature of a material flowing through a channel of the waste heat recovery system. Upon determining that the rate of change in the temperature of the material is predicted to be higher than the rate of change in the temperature of the heat exchanger, the waste heat recovery system calculates a valve position and valve timing for the channel that is configurable for achieving a rate of material flow that is determined to produce and maintain a defined threshold temperature of the heat exchanger, and actuates the valve according to the calculated valve position and time.

In yet another exemplary embodiment of the invention, a computer program product for implementing an optimized waste heat recovery system is provided. The computer program product includes a computer storage medium having computer-readable program code embodied thereon, which when executed by a computer processor causes the computer processor to implement a method. The method includes calculating a temperature and a rate of change in temperature of a heat exchanger of the waste heat recovery system, and predicting a temperature and a rate of change in temperature of a material flowing through a channel of the waste heat recovery system. Upon determining that the rate of change in the temperature of the material is predicted to be higher than the rate of change in the temperature of the heat exchanger, the optimized waste heat recovery system calculates a valve position and timing for the channel that is configurable for achieving a rate of material flow that is determined to produce and maintain a defined threshold temperature of the heat exchanger, and actuates the valve according to the calculated valve position and time.

The above features and advantages and other features and advantages of the invention are readily apparent from the following detailed description of the invention when taken in connection with the accompanying drawings.

BRIEF DESCRIPTION OF THE DRAWINGS

Other objects, features, advantages and details appear, by way of example only, in the following detailed description of embodiments, the detailed description referring to the drawings in which.

DESCRIPTION OF THE EMBODIMENTS

In accordance with an exemplary embodiment of the invention, a waste heat recovery system is provided. The waste heat recovery system provides an exhaust gas bypass valve and coolant flow controls for achieving optimum temperatures in a waste heat recovery device. The exemplary waste heat recovery system provides temperature stability of hot and cold side heat exchangers of its thermoelectric generators in order to maximize electrical power generation efficiency, as well as lengthen the useful life of its thermoelectric modules. In an exemplary embodiment, the waste heat recovery system uses logic to actuate the bypass valve in order to divert the exhaust gas when the gas is colder than the heat exchanger, and to actuate the coolant flow control to divert the coolant when the coolant is hotter than the cold side heat exchanger.

In an exemplary embodiment, the waste heat recovery system monitors the temperature difference between the heat exchangers and the material flowing through a channel in the waste heat recovery system so that the bypass valve and/or coolant controls can be actuated to prevent a reverse in the direction of the heat flow between the heat exchangers and the material. In the case when the exhaust gas becomes cooler than the hot side heat exchanger, or the coolant becomes hotter than the cold side heat exchanger, it is desirable to adjust the valve position that determines material flow in order to optimize the temperatures of the heat exchangers.

Control systems of a bypass valve may be designed to divert the exhaust gas around the thermoelectric generator when the exhaust gas temperature is too hot. Conversely, when the engine is operated at idle conditions following operation under a large load, for example, the exhaust gas temperature decreases and could become lower than that of the heat exchanger. Under this condition, heat would be extracted from the heat exchanger by the cooler exhaust gas rather than be available for recovery and conversion to electricity by the thermoelectric modules. Incorporating the exemplary waste heat recovery system processes in the bypass valve control system to actuate the bypass valve for diversion of the exhaust gas around the thermoelectric generator when the temperature of the exhaust gas is lower than the heat exchanger allows, the heat already captured by the heat exchanger to remain available to the thermoelectric modules for conversion to electricity. The temperature of hot side heat exchanger, and in turn the hot side of the thermoelectric modules, would remain higher and more stable compared to a scenario in which colder exhaust gas is allowed to flow through the thermoelectric generator. Similarly, flow control of the coolant would be used to restrict coolant flow into the cold side heat exchanger when the coolant temperature rises above that of the cold side heat exchanger.

Figure 1:
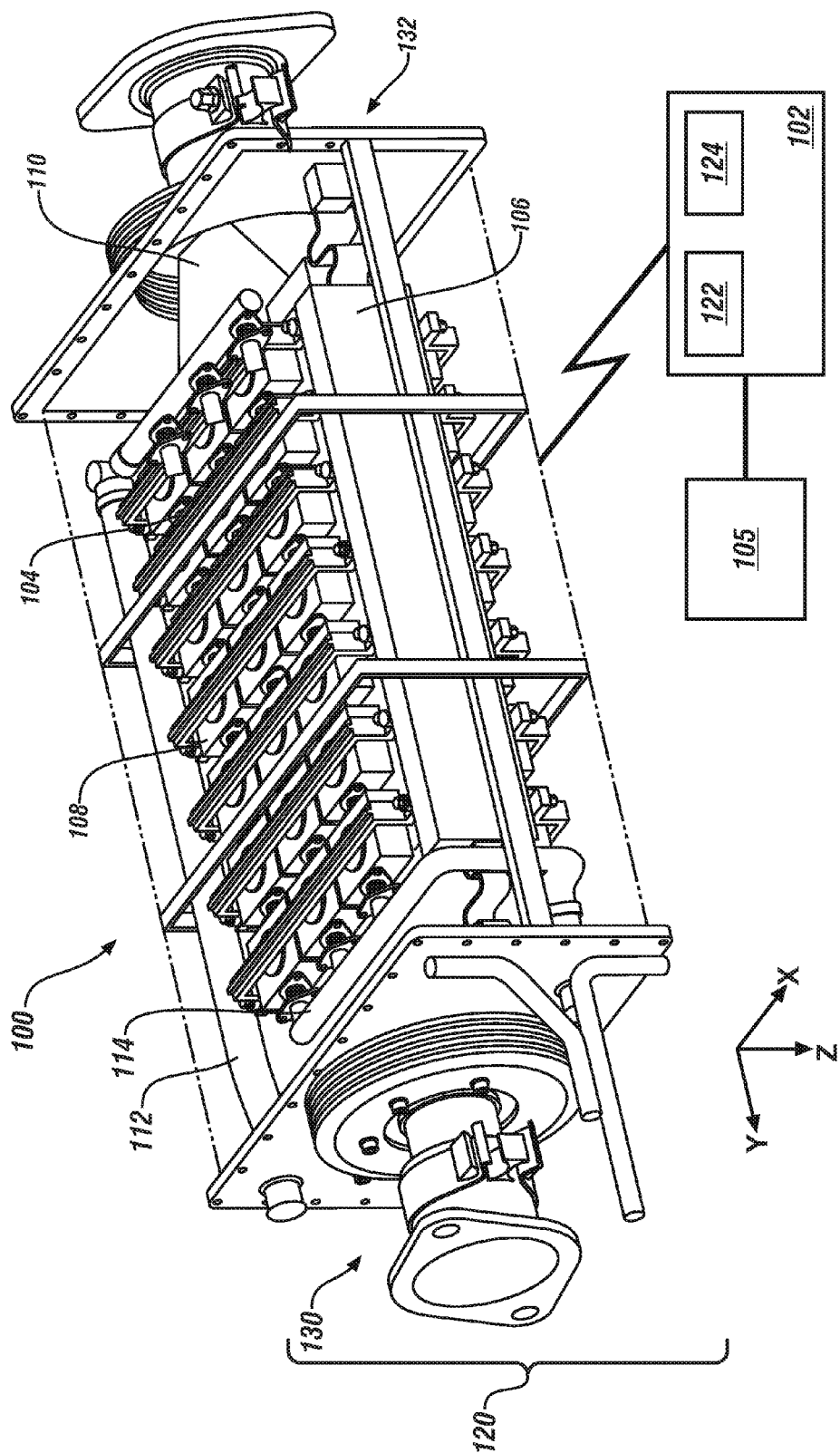
FIG. 1 is a schematic diagram illustrating a waste heat recovery system in an exemplary embodiment.
Figure 2:
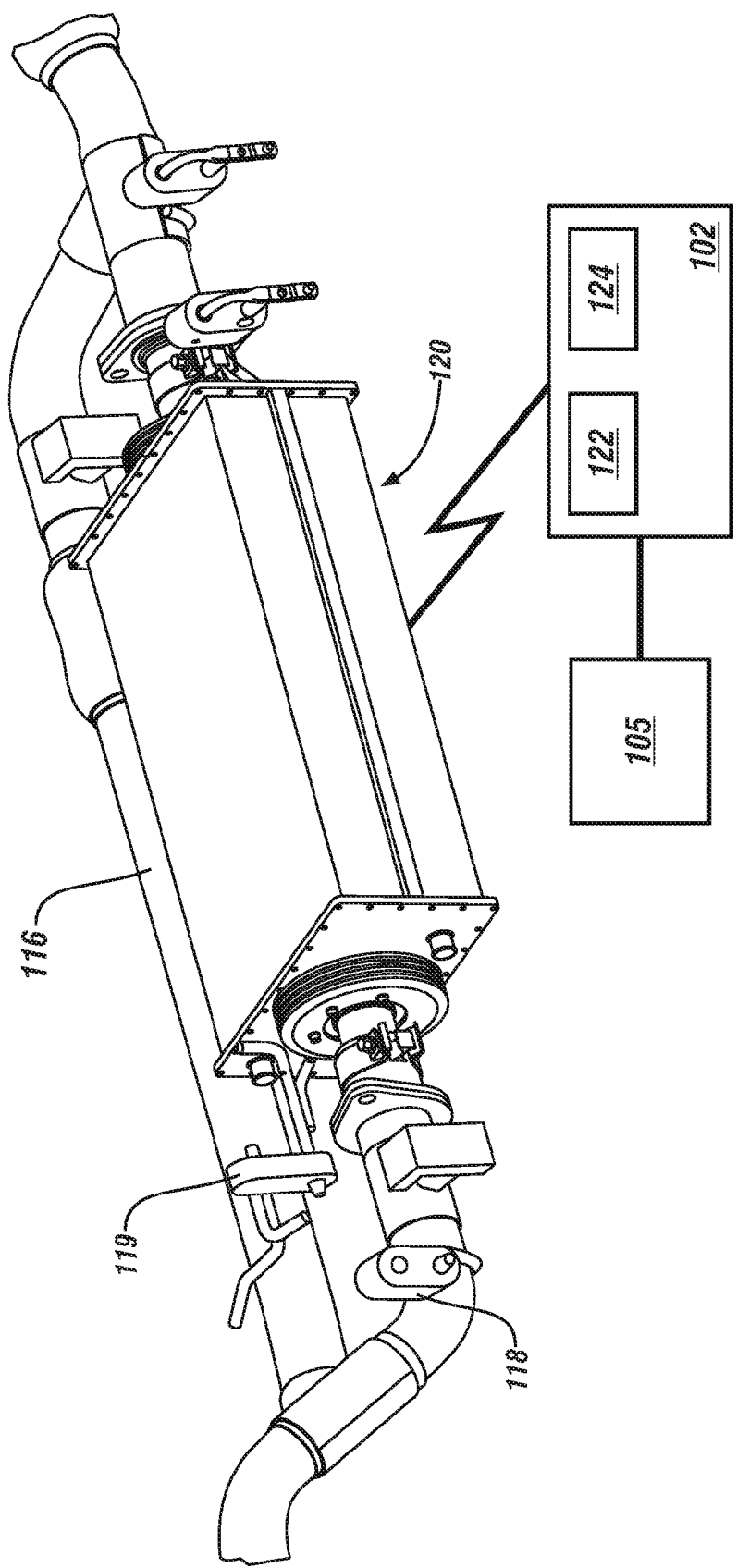
FIG. 2 is a schematic diagram illustrating details of the waste heat recovery system of FIG. 1 in an exemplary embodiment.

Turning now to FIGS. 1 and 2, schematic diagrams illustrating an exemplary waste heat recovery system 100 will now be described. The waste heat recovery system 100 includes a waste heat recovery device 120 in communication with a control system 102. The waste heat recovery device 120 may be a thermoelectric generator for an automobile engine that converts heat from an engine's exhaust gas into usable electricity. The waste heat recovery device 120 includes a cold side heat exchanger 104, a hot side heat exchanger 106, and thermoelectric modules 108.

The cold side heat exchanger 104 may use engine coolant as a means to extract heat from the cold side of the thermoelectric modules that comprise the thermoelectric generator. The hot side heat exchanger 106 extracts heat from the engine's exhaust gas and directs it into the hot side of thermoelectric modules 108. The heat thereby flowing through the thermoelectric modules 108 is converted into useful electricity. The conversion efficiency of this heat flow into electricity is a strong function of the operating temperature of the thermoelectric generator, the intrinsic thermoelectric conversion performance of the thermoelectric modules 108 themselves at their operating temperature, and the temperature difference between the hot and cold sides of the thermoelectric modules 108.

The waste heat recovery device 120 also includes an exhaust component 110 that channels the flow of an engine's exhaust gas through the waste heat recovery device 120. As shown in FIG. 1, the exhaust component 110 comprises a hollow channel extending along a y axis with respect to the waste heat recovery device 120. Exhaust gas from the engine flows into the exhaust component 110 through a first end 130 of the waste heat recovery device 120 and out through a second end 132 of the waste heat recovery device (see, for example, FIG. 4 which illustrates the directional flow of the exhaust gas).

The waste heat recovery device 120 further includes coolant lines 112 and 114 that channel coolant through the waste heat recovery device 120. Coolant lines 112 direct coolant flow into the waste heat recovery device 120, and coolant lines 114 direct coolant flow out of the waste heat recovery device 120. The coolant lines 112 may be connected though flow control valves to the coolant system of the vehicle, or there may be a separate coolant system dedicated to the thermoelectric generator.

The waste heat recovery device 120 also includes an exhaust bypass 116 and an exhaust bypass valve 118 that diverts the flow of exhaust gas away from the exhaust component 110 and to the exhaust bypass 116 as described further herein. Additionally, the waste heat recovery device 120 includes a coolant valve 119 for controlling the amount of coolant that may flow through the coolant lines 112 and 114 as will be described further herein.

As indicated above, the exemplary waste heat recovery system 100 includes a control system 102 in communication with the waste heat recovery device 120. The control system 102 includes a computer processor (e.g., one or more computer processing units) 122 and processor logic 124 that receives information from the vehicle's sensors and/or main control unit, and from the waste heat recovery device 120. The control system 102 uses the information to control exhaust gas flow and coolant flow with respect to the waste heat recovery device 120. The control system 102 for the waste heat recovery system 100 may be incorporated into a main control unit (or engine control module) of the vehicle, or it may be a standalone unit. In an exemplary embodiment, the processor logic 124 analyzes a multitude of variables, such as engine speed, exhaust gas flow rate, engine load, engine throttle position, rate of fuel consumption, hot side and cold side heat exchanger temperatures, exhaust gas temperature sensor data, exhaust gas temperature prediction data, coolant temperature and flow rates, and rate of heat extraction generated by a thermoelectric module 108. These values are either available directly from the vehicle main control unit (engine control module) or vehicle sensors, such as sensors 105. Sensors 105 and controls for bypass valves for exhaust gas and coolant flow into and out of the thermoelectric generator are communicatively coupled to the control system 102 for the thermoelectric generator.

Figure 3:
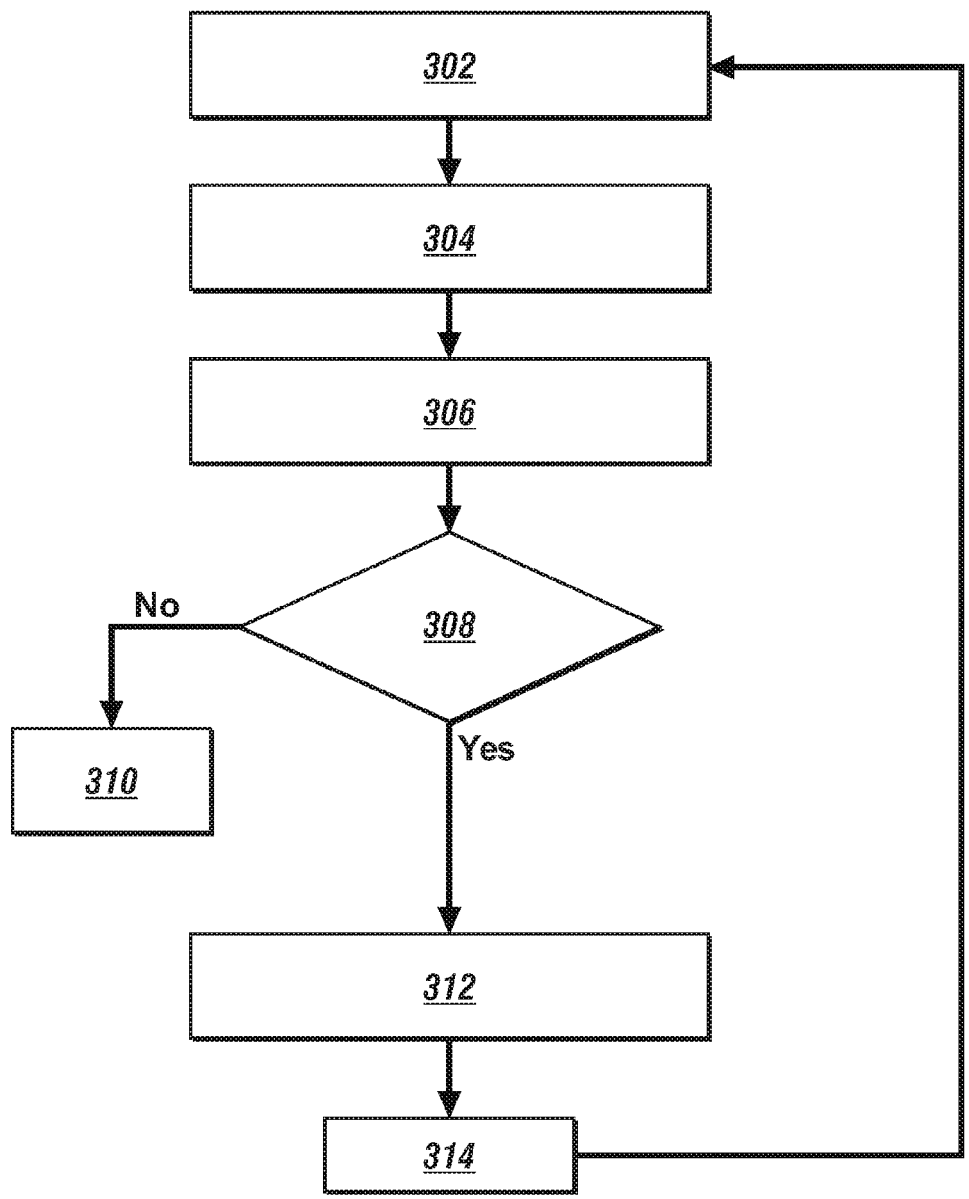
FIG. 3 is a flow diagram describing a process for implementing bypass valve and coolant flow controls in a waste heat recovery system according to an exemplary embodiment.
Figure 4:
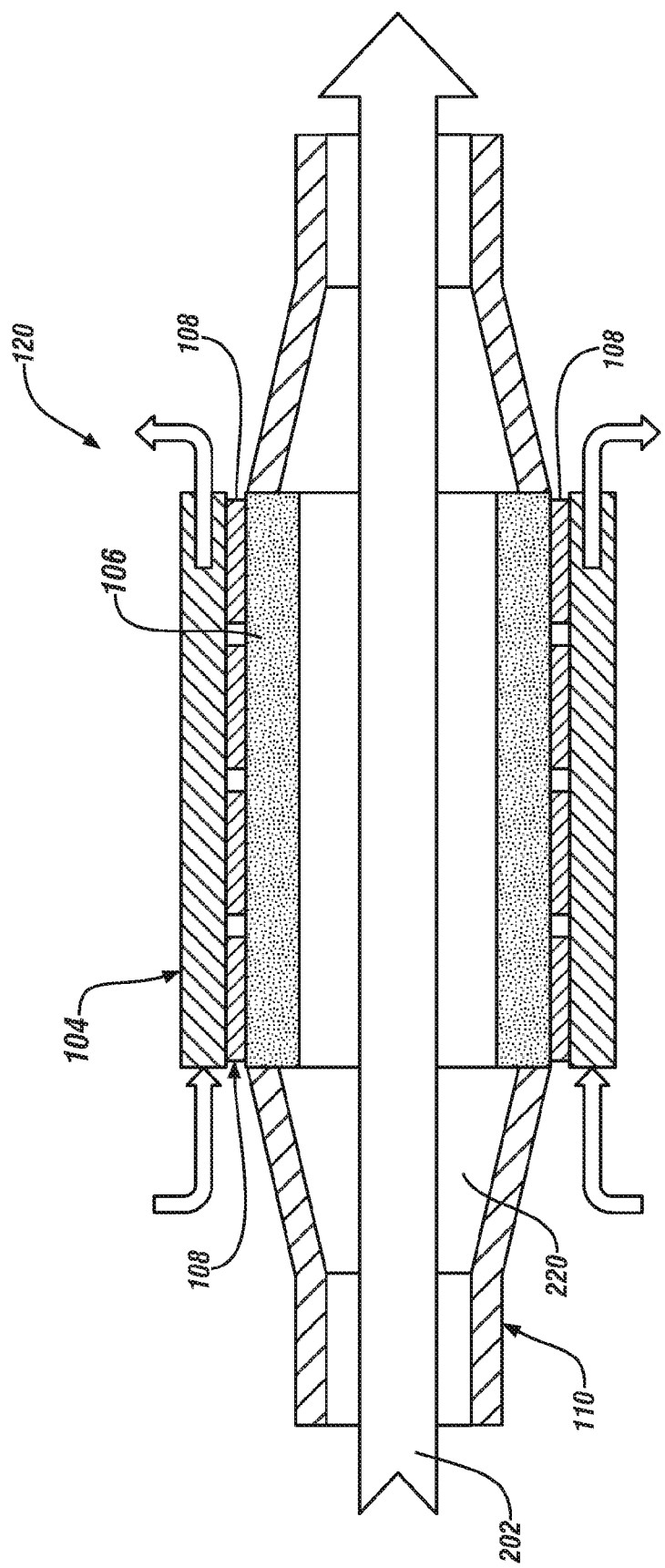
FIG. 4 is a schematic diagram illustrating bypass valve controls and coolant flow controls of a waste heat recovery system for a vehicle engine in an exemplary embodiment.

In an exemplary embodiment, the waste heat recovery system 100 monitors ongoing conditions of a vehicle, such as the intensity of the load of the vehicle's engine in order to determine how and when the bypass valve 118 and coolant flow control valve 119 are manipulated. The waste heat recovery system 100 manages bypass valve controls for maintaining a maximum hot side heat exchange temperature, as well as managing coolant flow for maintaining a minimum cold side heat exchange temperature. Turning now to FIGS. 3 and 4, an exemplary process and control flow scenarios will now be described in an exemplary embodiment.

At step 302, as part of the monitoring process, the control system 102 gathers temperature data for the heat exchangers 104 and 106 and calculates a rate of change in temperature of a heat exchanger, i.e., one of hot side heat exchanger 106 and cold side heat exchanger 104 of the waste heat recovery device 120. This temperature difference may be acquired by sampling temperature values at different time periods to determine rates of changes in these temperature values.

At step 304, the control system 102 gathers additional data relating to the operating conditions of the vehicle engine. As indicated above, such data may include one or more of engine speed, exhaust gas flow rate, engine load, engine throttle position, rate of fuel consumption, hot side and cold side heat exchanger temperatures, exhaust gas temperature sensor data, exhaust gas temperature prediction data, coolant temperature and flow rates, and rate of heat extraction generated by a thermoelectric module 108. This data, such as engine speed, provides useful information in determining the load on the engine, which can effectuate various temperature differences and changes in the vehicle components.

At step 306, the control system 102 uses the information acquired in steps 302 and 304 to predict a rate of change in temperature of a material flowing through a channel of the waste heat recovery device 120. The particular material and channel subject to the prediction is based upon the type of heat exchanger being monitored. For example, when monitoring the hot side heat exchanger 106, the material monitored is the exhaust gas and the channel is the exhaust component 110. The rate of change in the temperature of the hot side heat exchanger 106 and the rate of change in the temperature of the exhaust gas both reflect a rate of decrease in temperature of the hot side heat exchanger 106, as will be described further herein. When monitoring the cold side exchanger 104, the material monitored is the coolant, and the channel is the coolant lines 112 and 114. The rate of change in the temperature of the cold side heat exchanger 104 and the rate of change in the temperature of the coolant both reflect a rate of increase in temperature of the cold side heat exchanger 104, as will be described further herein.

At step 308, the control system 102 determines whether the rate of change in the temperature of the material (e.g., the exhaust gas or the coolant) is greater than the rate of change in the temperature of the heat exchanger. This step also includes a determination of when a crossover in temperature occurs between the heat exchanger and the material flowing through it. At step 310, upon determining the rate of change in the temperature of the material is not greater than the rate of change in the temperature of the heat exchanger, the control system 102 maintains a current position of corresponding valve, i.e., the exhaust bypass valve 116 if the hot side heat exchanger 106 is being monitored or the coolant valve 119 if the cold side heat exchanger 104 is being monitored.

If, however, the control system 102 determines that the rate of change in the temperature of the material is higher than the rate of change in the temperature of the heat exchanger so that the hot side heat exchanger 106 will become hotter than the exhaust gas (i.e., the material), or the cold side heat exchanger 104 will become colder than the engine coolant (i.e., the material), then the control system 102 calculates a valve position and timing for actuating that valve so that the appropriate channel, or channels, are configured for achieving a rate of material flow that is determined to produce and maintain a defined threshold temperature or to optimize the temperature of the heat exchanger at step 312.

At step 314, the control system 102 actuates the valve according to the calculated position of each valve. The valve actuation is further described below.

FIG. 4 illustrates the waste heat recovery device 120 and the exhaust bypass and coolant flow controls. When a vehicle is operating under a heavy load, for example, heat produced by the engine flows into the hot side heat exchanger 106 from exhaust gas flow 202 passing through an exhaust chamber 220 of the exhaust component 110. The heat flows through the thermoelectric modules 108 to the cold side heat exchanger 104 and is converted to electricity, which is output through the thermoelectric modules 108.

Further, heat from the exhaust gas flows from the gas into the hot side heat exchanger 106 until the temperatures of the hot side heat exchanger 106 and the exhaust gas are equal. This may require actuation of the exhaust bypass valve 118 to restrict the heat flow in order to prevent the temperature from exceeding the maximum allowable operating temperature or other threshold value set for the device 120. If the conditions change to a light load, the temperature of the exhaust gas may fall below that of the hot side heat exchanger 106 (i.e., a hot side temperature crossover), at which point the heat from the hot side heat exchanger 106 would then flow into the exhaust gas flow 202, thereby reducing the temperature of the hot side heat exchanger 106 faster than would happen without the exhaust gas flow through the hot side heat exchanger 106. By stopping the exhaust gas flow under this condition, a higher temperature can be maintained for a longer time in the hot side heat exchanger 106, allowing the thermoelectric modules 108 to convert more heat to electricity. Analogously, when the vehicle is operating under a light load, heat will flow from the cold side heat exchanger 104 into the coolant. If the conditions change to a heavy load, the engine coolant temperature may rise faster than the temperature of the cold side heat exchanger 104 so that it becomes hotter than the cold side heat exchanger 104. At the point in time when the coolant temperature is higher (i.e., a cold side temperature crossover), it would be advantageous to stop the coolant flow so that heat would not flow from the coolant into the cold side heat exchanger 104 and raise its temperature. Thus, the coolant valve 119 may be actuated to reduce or prevent the flow of coolant through the coolant lines 112 and 114.

As indicated above, the control system 102 monitors the rate of decrease in temperature of the hot side heat exchanger 106, as well as the rate of decrease in temperature of the exhaust gas. The control system 102 uses data collected relating to the current vehicle conditions to generate a prediction from these values as to when a hot side temperature crossover would occur in the hot side heat exchanger 106. In an exemplary embodiment, when the control system 102 determines that the rate of temperature decrease of the exhaust gas is greater than the rate of temperature decrease of the hot side heat exchanger 106, this means the exhaust gas is cooling off faster than the hot side heat exchanger. In this instance, when the temperature crossover occurs, the control system 102 activates the exhaust bypass valve 118 to divert the flow of exhaust gas away from the exhaust component 110 and through the exhaust bypass 116.

If the rate of decrease in temperature of the exhaust gas is predicted to be less than the rate of decrease in temperature of the hot side heat exchanger 106, a temperature crossover will not occur, and the control system 102 maintains the current position of the exhaust bypass valve 118 up to heat limits.

Additionally, as indicated above, the control system 102 monitors the rate of increase in temperature of the cold side heat exchanger 104, as well as the rate of increase in temperature of the coolant. The control system 102 uses data collected relating to the current vehicle conditions to generate a prediction from these values as to when a cold side temperature crossover would occur in the cold side heat exchanger 104. In an exemplary embodiment, when the control system 102 determines that the rate of temperature increase of the coolant is greater than the rate of temperature increase of the cold side heat exchanger 104, this means the coolant is warming up at a faster rate than is the cold side heat exchanger 104. In this instance, when the cold side temperature crossover occurs, the control system 102 activates the coolant bypass valve 119 to restrict the flow of coolant passing through the coolant lines 112 and 114.

If the rate of increase in temperature of the coolant is predicted to be less than the rate of increase in temperature of the cold side heat exchanger 104, a cold side temperature crossover will not happen, and the control system 102 maintains the current position of the coolant bypass valve 119.

Technical effects include the ability to monitor the temperature difference between heat exchanger and the material flowing through a channel in a waste heat recovery system so that the bypass valves and/or coolant controls can be actuated to prevent a reverse in the direction of the heat flow between the heat exchangers and the material. In the case when the exhaust gas becomes cooler than the hot side heat exchanger, or the coolant becomes hotter than the cold side heat exchanger, it is desirable to adjust the valve positions in order to optimize the temperatures of the heat exchangers.

As described above, the invention may be embodied in the form of computer implemented processes and apparatuses for practicing those processes. Embodiments of the invention may also be embodied in the form of computer program code containing instructions embodied in tangible media, such as floppy diskettes, CD-ROMs, hard drives, or any other computer readable storage medium, wherein, when the computer program code is loaded into and executed by a computer, the computer becomes an apparatus for practicing the invention. An embodiment of the present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the present application.

What is claimed is:

1. A method for implementing an optimized waste heat recovery system, the method comprising:
   calculating a temperature and a rate of change in temperature of a heat exchanger of the waste heat recovery system;
   predicting a temperature and a rate of change in temperature of a material flowing through a channel of the waste heat recovery system;
   upon determining that the rate of change in the temperature of the material is predicted to be higher than the rate of change in the temperature of the heat exchanger, calculating a valve position and timing for the channel that is configurable for achieving a rate of material flow that is determined to produce and maintain a defined threshold temperature of the heat exchanger; and
   actuating the valve according to the calculated valve position and calculated timing;
   wherein the heat exchanger includes a cold side heat exchanger, the material is a coolant and the rate of change in the temperature of the cold side heat exchanger and the rate of change in the temperature of the coolant are increasing; and
   wherein the rate of increase in the temperatures of the cold side heat exchanger and coolant are calculated using at least one of: engine speed; engine load; engine throttle position; rate of fuel consumption; exhaust gas flow rate; hot side and cold side heat exchanger temperature sensor data; exhaust gas temperature sensor data; exhaust gas temperature prediction data; coolant temperature and flow rates; and rate of heat extraction generated by a thermoelectric module.

2. The method of claim 1, wherein the heat exchanger includes a hot side heat exchanger, the material is exhaust gas, and the rate of change in the temperature of the hot side heat exchanger and the rate of change in the temperature of the exhaust gas are decreasing.

3. The method of claim 2, wherein the decrease in the temperatures of the hot side heat exchanger and the exhaust gas are calculated using at least one of:
   engine speed;
   engine load;
   engine throttle position;
   rate of fuel consumption;
   exhaust gas flow rate;
   hot side and cold side heat exchanger temperature sensor data;
   exhaust gas temperature sensor data;
   exhaust gas temperature prediction data;
   coolant temperature and flow rates; and
   rate of heat extraction generated by a thermoelectric module.

4. The method of claim 2, wherein the valve is an exhaust bypass valve, and wherein actuating the exhaust bypass valve comprises redirecting at least a portion of the exhaust gas away from the channel and through a bypass channel.

5. The method of claim 1, wherein the valve is a coolant flow valve, and wherein actuating the coolant flow valve comprises restricting flow of the coolant through the channel.

6. A system for implementing an optimized waste heat recovery system, the system comprising:
   a control system comprising a computer processor, the control system in communication with a waste heat recovery system; and
   logic configured to execute on the computer processor, the logic implementing a method, the method comprising:
   calculating a temperature and a rate of change in temperature of a heat exchanger of the waste heat recovery system;
   predicting a temperature and a rate of change in temperature of a material flowing through a channel of the waste heat recovery system;

upon determining that the rate of change in the temperature of the material is predicted to be higher than the rate of change in the temperature of the heat exchanger, calculating a valve position and timing for the channel that is configurable for achieving a rate of material flow that is determined to produce and maintain a defined threshold temperature of the heat exchanger; and actuating the valve according to the calculated valve position and calculated timing;

wherein the heat exchanger includes a cold side heat exchanger, the material is a coolant, and the rate of change in the temperature of the cold side heat exchanger and the rate of change in the temperature of the coolant are increasing; and wherein the rate of increase in the temperatures of the cold side heat exchanger and coolant are calculated using at least one of: engine speed; engine load; engine throttle position; rate of fuel consumption; exhaust gas flow rate; hot side and cold side heat exchanger temperature sensor data exhaust gas temperature sensor data; exhaust gas temperature prediction data; coolant temperature and flow rates; and rate of heat extraction generated by a thermoelectric module.

7. The system of claim 6, wherein the heat exchanger includes a hot side heat exchanger, the material is exhaust gas, and the rate of change in the temperature of the hot side heat exchanger and the rate of change in the temperature of the exhaust gas are decreasing.

8. The system of claim 7, wherein the decrease in the temperature of the hot side heat exchanger and the exhaust gas are calculated using at least one of:
- engine speed;
- engine load;
- engine throttle position;
- rate of fuel consumption;
- exhaust gas flow rate;
- hot side and cold side heat exchanger temperature sensor data;
- exhaust gas temperature sensor data;
- exhaust gas temperature prediction data;
- coolant temperature and flow rates; and
- rate of heat extraction generated by a thermoelectric module.

9. The system of claim 7, wherein the valve is an exhaust bypass valve, and wherein actuating the exhaust bypass valve comprises redirecting at least a portion of the exhaust gas away from the channel and through a bypass channel.

10. The system of claim 6, wherein the valve is a coolant flow value, and wherein actuating the coolant flow valve comprises restricting flow of the coolant through the channel.

11. A computer program product for implementing an optimized waste heat recovery system, the computer program product comprising a computer storage medium having computer-readable program embodied thereon, which when executed by a computer processor cause the computer processor to implement a method, the method comprising:

calculating a temperature and a rate of change in temperature of a heat exchanger of the waste heat recovery system;

predicting a temperature and a rate of change in temperature of a material flowing through a channel of the waste heat recovery system;

upon determining that the rate of change in the temperature of the material is predicted to be higher than the rate of change in the temperature of the heat exchanger, calculating a valve position and timing for the channel that is configurable for achieving a rate of material flow that is determined to produce and maintain a defined threshold temperature of the heat exchanger; and actuating the valve according to the calculated valve position and calculated timing;

wherein the heat exchanger includes a cold side heat exchanger, the material is a coolant, and the rate of change in the temperature of the cold side heat exchanger and the rate of change in the temperature of the coolant are increasing; and wherein the rate of increase in the temperatures of the cold side heat exchanger and coolant are calculated using at least one of: engine speed; engine load; engine throttle position; rate of fuel consumption; exhaust gas flow rate; hot side and cold side heat exchanger temperature sensor data; exhaust gas temperature sensor data; exhaust gas temperature prediction data; coolant temperature and flow rates; and rate of heat extraction generated by a thermoelectric module.

12. The computer program product of claim 11, wherein the heat exchanger includes a hot side heat exchanger, the material is exhaust gas, and the rate of change in the temperature of the hot side heat exchanger and the rate of change in the temperature of the exhaust gas are decreasing.

13. The computer program product of claim 12, wherein the decrease in the temperature of the hot side heat exchanger and the exhaust gas are calculated using at least one of:
- engine speed;
- engine load;
- engine throttle position;
- rate of fuel consumption;
- exhaust gas flow rate;
- hot side and cold side heat exchanger temperature sensor data;
- exhaust gas temperature sensor data;
- exhaust gas temperature prediction data;
- coolant temperature and flow rates; and
- rate of heat extraction generated by a thermoelectric module.

14. The computer program product of claim 12, wherein the valve is an exhaust bypass valve, and wherein actuating the exhaust bypass valve comprises redirecting at least a portion of the exhaust gas away from the channel and through a bypass channel.

15. The computer program product of claim 11, wherein the valve is a coolant flow valve, and wherein actuating the coolant flow valve comprises restricting flow of the coolant through the channel.

* * * * *